United States Patent
Chi et al.

[11] Patent Number: 6,091,635
[45] Date of Patent: Jul. 18, 2000

[54] ELECTRON INJECTION METHOD FOR SUBSTRATE-HOT-ELECTRON PROGRAM AND ERASE $V_T$ TIGHTENING FOR ETOX CELL

[75] Inventors: Min-hwa Chi; Chih Ming Chen, both of Hsinchu, Taiwan

[73] Assignee: Worldwide Semiconductor Manufacturing Corporation, Hsinchu, Taiwan

[21] Appl. No.: 09/275,523

[22] Filed: Mar. 24, 1999

[51] Int. Cl.[7] .................................................. G11C 16/00
[52] U.S. Cl. .................................. 365/185.18; 365/185.28
[58] Field of Search ........................ 365/185.28, 185.27, 365/185.18

[56] References Cited

U.S. PATENT DOCUMENTS

| | | | |
|---|---|---|---|
| 5,457,652 | 10/1995 | Brahmbhatt | 365/185.18 |
| 5,487,033 | 1/1996 | Keeney et al. | 365/185.27 |
| 5,561,620 | 10/1996 | Chen et al. | 365/185.18 |
| 5,770,963 | 6/1998 | Akaogi et al. | 365/185.27 |
| 5,940,324 | 8/1999 | Chi et al. | 365/185.18 |
| 5,956,271 | 9/1999 | Kaya | 365/185.27 |
| 5,963,476 | 10/1999 | Hung et al. | 365/185.18 |

*Primary Examiner*—Tan T. Nguyen
*Attorney, Agent, or Firm*—Blakely, Sokoloff, Taylor, and Zafman, LLP

[57] ABSTRACT

A new method for injecting electrons from a forward biased deep n-well to p-well junction underneath the channel area of a triple-well ETOX cell during substrate hot electron (SHE) programming. The ETOX cell has a control gate, a floating gate, a deep n-well formed in the substrate, a p-well formed in the n-well, a drain implant formed in the p-well, and a source implant formed in the p-well. The method comprises the steps of: forward biasing the deep n-well relative to the p-well; positively biasing the control gate by a voltage sufficient to invert the channel between the source implant and the drain implant; and positively biasing the source and drain. The SHE programming has at least 100 times higher efficiency than channel hot electron (CHE). The cell threshold voltage ($V_T$) saturates to a value in a self-convergent manner. The SHE can also be used for tightening the Vt spread by a re-programming technique after erase.

8 Claims, 4 Drawing Sheets

$V_{CH} = V_S = V_D$

ELECTRON INJECTION METHOD FOR SUBSTRATE-HOT-ELECTRON PROGRAM AND ERASE $V_T$ TIGHTENING FOR ETOX CELL

FIELD OF THE INVENTION

The present invention relates to ETOX flash memory formed in triple wells, and more particularly, to a new electron injection method for substrate hot-electron (SHE) injection with self-convergent program and erase $V_T$ tightening schemes.

BACKGROUND OF THE INVENTION

The stack-gate ETOX cell, one of the most popular cell structures for flash memories, is widely programmed by channel hot-electron (CHE) and erased by Fowler-Nordheim (FN) tunneling through the source side or the channel area.

The n-channel ETOX cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the highest potential (Vcc) and the p-well is biased to the lowest potential (Vss). The n+ source is typically doubly implanted by $As^{75}$ (with a high dose of ~1E16/cm² for the n+ junction) and $P^{31}$ (with a lower dose of ~1E14/cm² for the n-junction) so that the source junction can be biased at high voltage (e.g. ~12 v) during erase operation. The n + drain is typically implanted by As only with a high dose (~1E16/cm²) and the drain side does not need the lightly-doped-drain (LDD) implant and spacer structure.

Note that the LDD structure is not useful in an ETOX cell, although it is important in normal CMOS transistors for reducing electrical field during switching for lower hot-electron generation. The tunnel oxide ($T_{ox}$) is typically 80–120 angstroms thick, the inter-poly dielectric ($T_{pp}$) typically consists of thin oxide-nitride-oxide (ONO) layers. As an example, a typical ETOX cell based on 0.35 um CMOS design rule has the following cell parameters: $T_{ox}$~90 angstroms, $T_{pp}$~160 angstroms (oxide equivalent thickness), and control-gate to floating-gate coupling ratio of ~0.8.

The ETOX cell of FIG. 1 is typically programmed by channel-hot-electrons (CHE). The bias for programming is typically: $V_d$~7 v, $V_{cg}$~9–12 v, and $V_s$=0 v. Under these bias conditions, there is a large channel current (~1 mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is typically erased by Fowler-Nordheim (F-N) tunneling through the source side or the channel area. The bias during source side erase is typically: $V_d$~0 v or floating, $V_{cg}$~-5 v to 0 v, and $V_s$=+9 to +12 v. This establishes a large electrical field (~10 Mv/cm) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d$~floating, $V_{cg}$~-15 v, $V_{pw}$~0 v. A large electrical field (-10 Mv/cm) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high field during erase.

The read biases of the prior art ETOX cell are typically: $V_d$~1 v to 2 v, $V_{cg}$~$V_{cc}$, $V_s$~0 v, $V_{pw}$~0 v, $V_{dnw}$=Vcc, and $V_{sub}$~0 v. The channel may be inverted or not depending on the net electron charge stored on the floating-gate, and results in the on and off of the cell as measured by the read current $I_{read}$ representing the digital information of "1" or "0" stored in the cell.

The prior art ETOX cell of FIG. 1 can be programmed by another method known as substrate-hot-electron (SHE) as shown in FIG. 2. As seen in FIG. 2, an additional n+ junction is needed (i.e., the "injection" junction) for injecting electrons through the forward-biased n+ injection junction to p-well junction. Unfortunately, most of the injected electrons are not diffused towards the channel area, but instead toward the nearby n+ source junction. Furthermore, the n+ source, p-well, and the n+ "injection" junction form a lateral npn bipolar transistor. The bipolar action of the npn bipolar transistor results in a large bipolar current at the node of n+ injection junction. Therefore, the SHE program scheme for the ETOX cell is not only very slow but also requires a large cell size due to the additional "injection" junction. As a result, this type of SHE programming scheme is not popular in commercial EPROMs or ETOX flash memories.

Another more recent SHE was reported in I. C. Chen, Kaya, and J. Paterson, "Band-to-band Tunneling Induced Substrate Hot-electron (BBISHE) Injection: A New Programming Mechanism for Nonvolatile Memory Devices," *Tech. Digest Intl.* Electron Devices Meetings, p. 263, 1989. The hot electrons are generated by the impact ionization of energetic holes, which are released by the band-to-band tunneling electrons in a deep depleted p-type island in the middle of the channel area of the EPROM cell. The injection efficiency is very high (relative to conventional SHE) by generating hot electrons close to the channel area. However, the cell size is large due to the heavily doped additional p-type island.

What is needed is a method for efficiently programming a triple-well ETOX cell without increasing the size of the cell.

SUMMARY OF THE INVENTION

A method of programming an ETOX cell formed from a triple-well process in a semiconductor substrate is disclosed. The ETOX cell has a control gate, a floating gate, a deep n-well formed in said substrate, a p-well formed in said n-well, a drain implant formed in said p-well, and a source implant formed in said p-well. The method comprises the steps of: forward biasing said deep n-well relative to said p-well; positively biasing said control gate by a voltage sufficient to invert the channel between said source implant and said drain implant; and positively biasing said source and drain.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAIL DESCRIPTION OF THE PREFERRED EMBODIMENT

Figure 1:
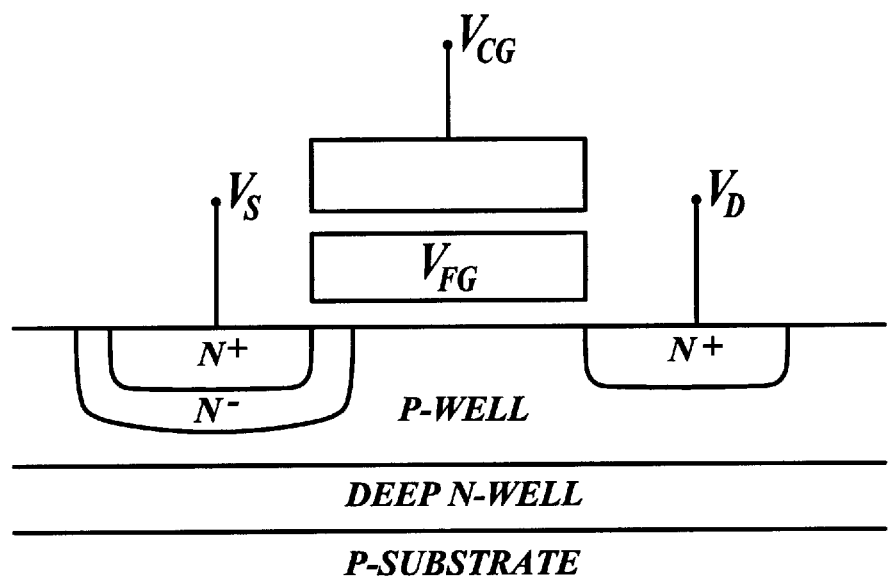
FIG. 1 is a schematic diagram of a prior art ETOX cell formed by a triple-well process.
Figure 2:
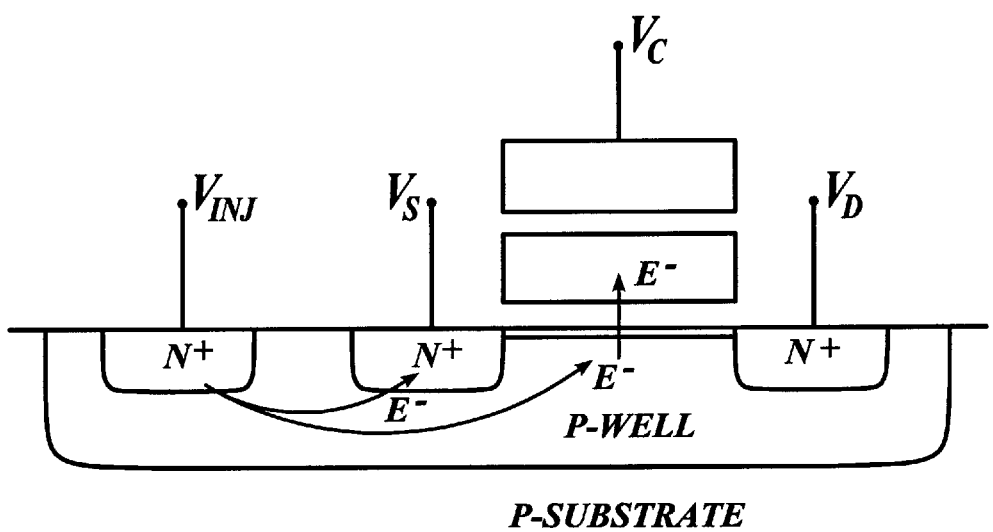
FIG. 2 is a schematic diagram of a prior art ETOX cell using an injection junction.
Figure 3:
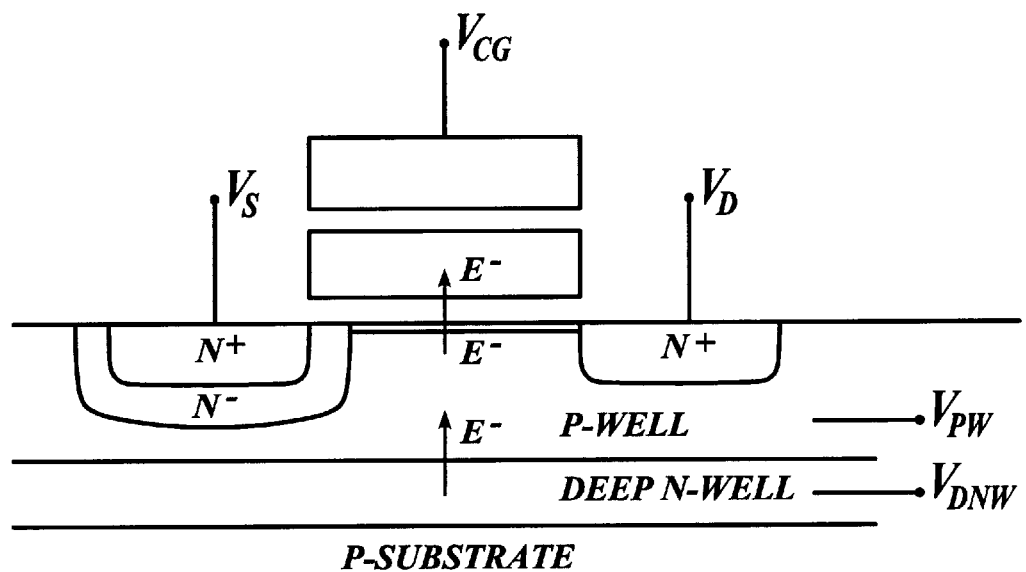
FIG. 3 is a schematic diagram of a triple-well ETOX cell during programming in accordance with the present invention.

The structure of a stack-gate ETOX cell in a triple-well is shown in FIG. 3. For an ETOX cell based on 0.35 um design rule, the following parameters are preferred: $T_{ox}$=95 A, $T_{ono}$=160 A, $\gamma_g$=0.75, W=0.6 um, L=0.6 um. $\gamma_g$ is the coupling ratio between the control gate and the floating gate.

The substrate hot electron (SHE) programming method of the present invention is qualitatively described first. The forward-biased deep n-well to p-well junction provides "seed" electrons (e.g. <1 uA/cell injecting and diffusing into the p-well. Preferably, the $V_{dnw}$=0 V and $V_{pw}$=0.5 volts. The control-gate is biased high enough (e.g., ~10 v–13 v) so that the channel is inverted. The source and drain junction are biased high enough (e.g., 5 v to 7 v) for accelerating (or heating up) those "seed" electrons toward the channel area and finally injecting the electrons onto the floating-gate. The control-gate potential ($V_{cg}$) establishes a field across the tunnel oxide for assisting hot electrons to inject toward the floating-gate.

Figure 4:
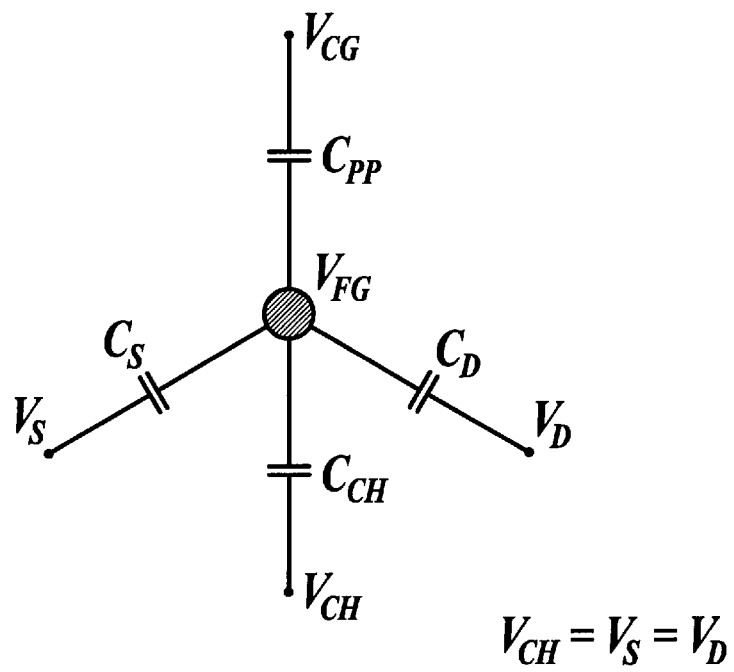
FIG. 4 is a schematic diagram of a lumped capacitor model of the ETOX cell of FIG. 3.

A simple analysis of SHE programming on ETOX cells is described here based on a lumped capacitor model of the ETOX cell shown in FIG. 4. The $V_{cg}$ can be estimated from charge conservation, $$C_{pp}(V_{fg}-V_{cg})+(C_s+C_d)(V_{fg}-V_d)+C_{ch}(V_{fg}-V_d)=Q_f \quad (1)$$

Let $C_t=C_{pp}+C_s+C_d+C_{ch}$. The coupling ratios are defined as: $\gamma_g=C_{pp}/C_t$; $\gamma_d=C_d/C_t$; $\gamma_s=C_s/C_t$; $\gamma_{ch}=C_{ch}/C_t$; and $\gamma_g+\gamma_d+\gamma_s+\gamma_{ch}=1$. The programming bias conduction for a 0.35 um ETOX cell is: $V_{cg}$=10 v to 13 v and $V_d$=Vs=5 v to 7 v. The p-well is grounded for convenience. $V_{fg}$ is high enough, i.e., $V_{fg}>V_t$ (at bias of $V_d$) for channel inversion. The $V_{fg}$ during programming is from Eq. (1), $$V_{fg}=Q_f/C_t+V_{cg}\gamma_g+V_d(\gamma_d+\gamma_s+\gamma_{ch})=Q_f/C_t+V_{cg}\gamma_g+V_d(1-\gamma_g) \quad (2)$$

During measurement of cell threshold voltage (i.e., $V_t\sim V_{to}/\gamma_g$), where $V_{to}$ is the threshold voltage viewed from the floating-gate: $V_d$~0.1 v, $V_s$=0, $V_{ch}$~0, $V_{cg}$=$V_t$, $V_{fg}$=$V_{to}$, from Eq. (2), $$V_{to}=Q_f/C_t+(V_t-0.1)\gamma_g+0.1 \cong Q_f/C_t+V_t\gamma_g \quad (3)$$

At the beginning of programming, $Q_f$~0, thus $V_t \cong V_{to}/\gamma_g$. As programming continues, $|Q_f|$ increases (i.e. more negative electron charge), and $V_{fg}$ decreases, until the $V_{fg}$ approaches a value of $V_d+V_{to(@Vd)}$ (i.e. the threshold-voltage viewed from floating-gate at body-bias of $V_d$), when the inversion is about to disappear. $V_{to(@Vd)} \sim V_{to}+\eta V_d$; where $\eta$ is the coefficient of the body-bias effect. Typically, $\eta$~0.15. When the inversion layer is about to disappear, the programming process becomes slow and almost stops; the $V_{fg}$ stays constant, and $Q_f$ saturates (also $V_t$ saturates). Thus, from Eq. (2) and Eq. (3), $$V_t\gamma_g \cong V_{to}-Q_f/C_t \cong (V_{to}-V_d-V_{to(@Vd)})+V_{cg}\gamma_g+V_d(1-\gamma_g) \cong V_{cg}\gamma_g-V_d(\gamma_g+\eta) \quad (4)$$

Figure 5:
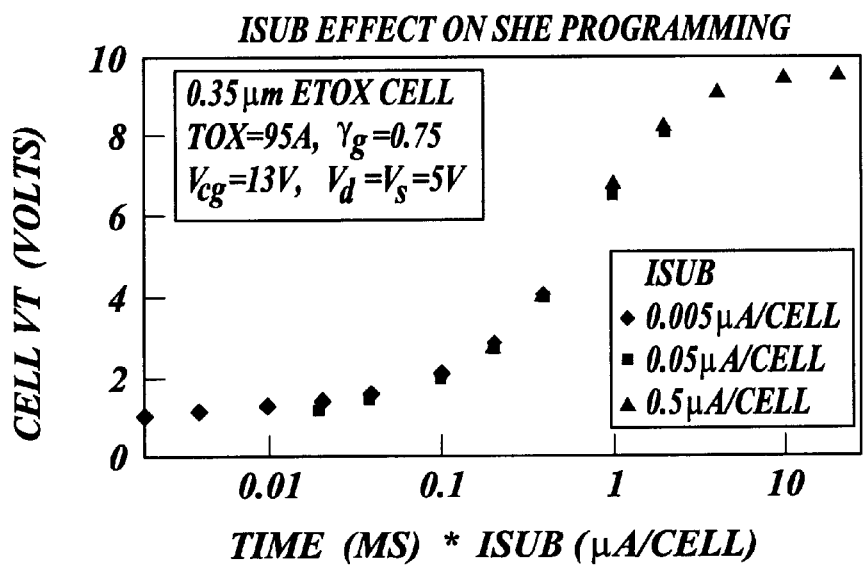
FIG. 5 is a graph is a universal programming curve for the programming method of the present invention.

Experimental programming curves on the ETOX cell of the present invention have been obtained. The programming speed is related to the magnitude of $I_{sub}$ (for providing seed electrons), the bias of $V_d$ and $V_s$ (for heating up electrons), and the $V_{cg}$ (for channel inversion and assisting hot electrons to inject across the tunnel oxide). FIG. 5 shows a universal program curve at constant $V_{cg}$, $V_d$, and $V_s$ with $I_{sub}$*time as a parameter. The cell $V_t$ saturates for long programming times. Compared to channel hot electron methods, the total SHE programming current is reduced by ~100X.

Figure 6:
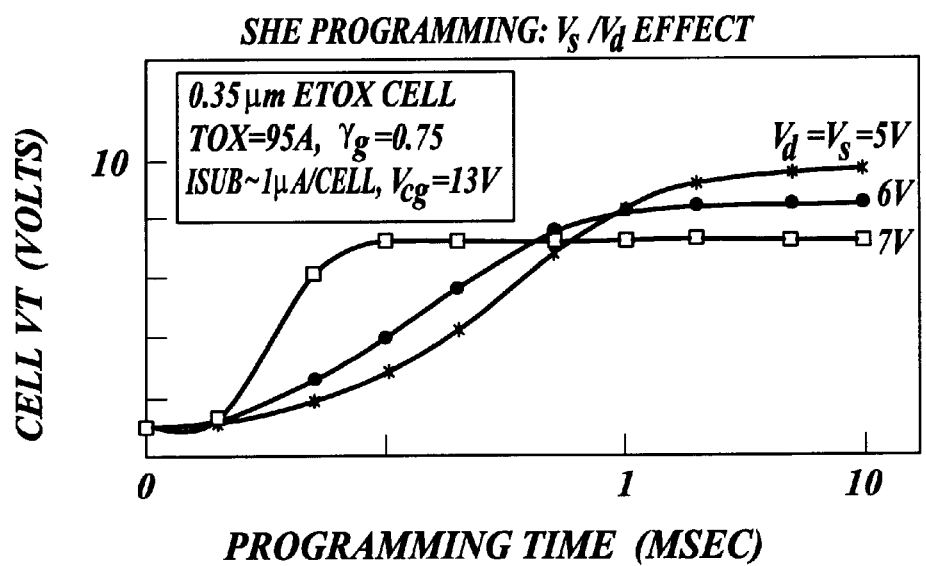
FIG. 6 is a graph showing the self convergence of $V_t$ for the programming method of the present invention.
Figure 7:
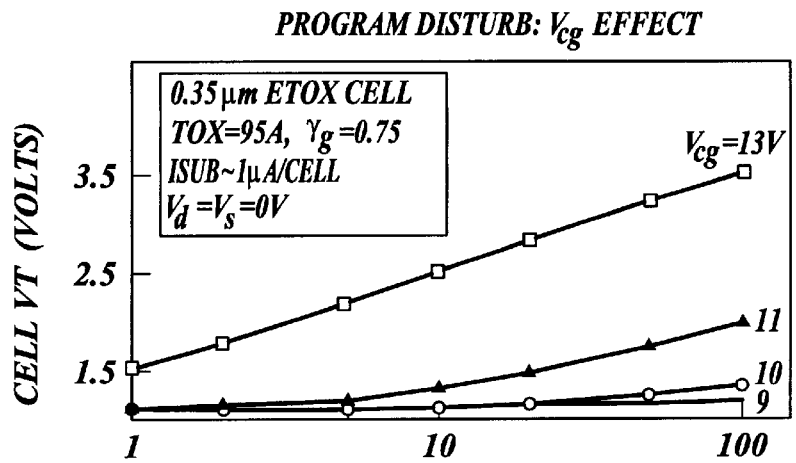
FIG. 7 is a graph of the program disturb characteristics for the programming method of the present invention.
Figure 8:
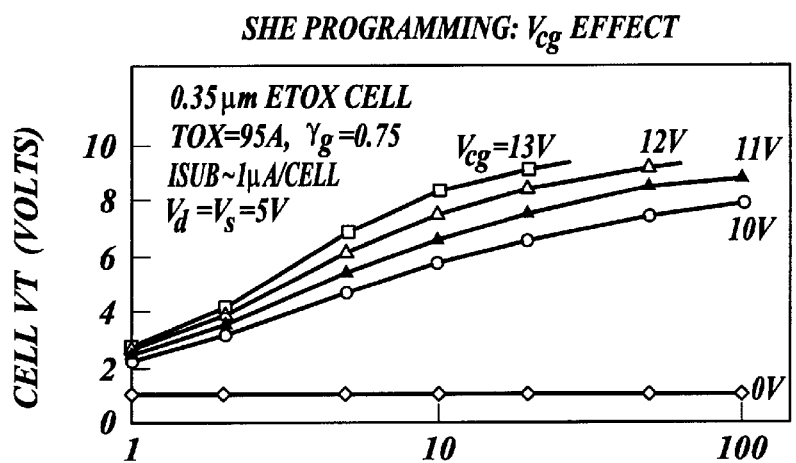
FIG. 8 is a graph is a programming curve at a constant bias with $V_{cg}$ as a parameter for the programming method of the present invention.

FIG. 6 demonstrates the self-convergence of SHE programming, where higher $V_d$ or $V_s$ results in faster programming and cell $V_T$ saturation to a lower level as predicted by Eq. (4). FIG. 7 shows program disturb characteristics with $V_{cg}$ as a parameter. The $V_{cg}$ during programming needs to be carefully selected to avoid program disturb by F-N tunneling. FIG. 8 shows SHE programming curves at constant bias of $V_d$, ($V_s$), and $I_{sub}$ with $V_{cg}$ as a parameter. Program disturb at $V_{cg}$=0 v is negligible.

Figure 9:
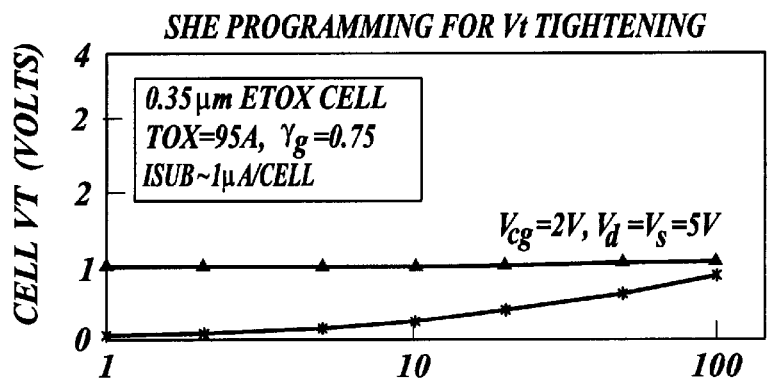
FIG. 9 is a graph showing effective tightening of $V_t$ after erase for the programming method of the present invention.

As noted above with respect to the prior art, the ETOX cell can be erased by F-N tunneling through either source-side or channel area. One serious problem is the wide $V_t$ spread after erase and the "tail-bits" for over-erase problems. See T. C. Ong, A. Fazio, N. Mielke, S. Pan, N. Righos, G. Atwood, S. Lai "Erratic Erase in ETOX Flash Memory Array", Paper 7A-2, Proceedings of VLSI Technology 1993. The tail-bits are those "weaker" bits which are erased faster abnormally than others by possibly local thinner oxide or latent defects. There are well known techniques for tightening the $V_t$ spread after erase by reprogramming using CHE (see S. Yamada, et. al., "A Self-convergence Erase Scheme for a Simple Stacked Flash EEPROM," Tech. Digest Intl. Electron Devices Meetings, p. 307, 1991) or F-N tunneling (see K. Oyada, et al., "A Novel Erasing Technology for 3.3 v Flash Memory with 64 Mb Capacity and Beyond," Tech. Digest Intl. Electron Devices Meetings, pp.607–610, 1992). The present invention is also an effective technique for tightening $V_t$ after erase as demonstrated in FIG. 9.

In accordance with a further aspect of the present invention, the injection of electrons from the deep n-well to p-well junction can be improved. If the deep n-well dopant concentration is made higher than the p-well, then the electron injection can be significantly enhanced. Unfortunately, this is impossible when the deep n-well is formed by the conventional dopant implant and drive-in method. In an alternative embodiment, the deep n-well is formed by a high energy implant (e.g. implant high energy P31 by using an MeV implanter) so that the n-type dopants in the deep n-well are distributed in a retrograding manner. This can improve the electron injection efficiency from the deep n-well and can improve the SHE programming speed significantly.

The erase operation and read operation of the ETOX cell with triple-well is the same as conventional ETOX cell.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of programming an ETOX cell formed from a triple-well process in a semiconductor substrate, said ETOX cell having a control gate, a floating gate, a deep n-well formed in said substrate, a p-well formed in said n-well, a drain implant formed in said p-well, and a source implant formed in said p-well, the method comprising the steps of:

forward biasing said p-well relative to said deep n-well;
   positively biasing said control gate by a voltage sufficient to invert the channel between said source implant and said drain implant; and
   positively biasing said source and drain.

2. The method of claim 1 wherein said deep n-well is grounded and said p-well is positively biased.

3. The method of claim 1 wherein said control gate is biased to between 10 to 13 volts and said source implant and said drain implant is biased to between 5 to 7 volts.

4. The method of claim 3 wherein said deep n-well is grounded and said p-well is positively biased.

5. An ETOX cell formed from a triple-well process in a semiconductor substrate, said ETOX cell comprising:

a deep n-well formed within said substrate, said deep n-well formed using a MeV implanter so that the deep n-well has dopants distributed in a retrograding manner;

a p-well formed within said deep n-well, said p-well having a dopant concentration lower than said deep n-well;

a floating gate formed above said p-well, said floating gate separated from said substrate by a thin oxide layer;

a control gate formed above said floating gate, said floating gate and said control gate separated by a dielectric layer;

a drain implant formed in said p-well and adjacent to a first edge of said floating gate; and a source implant formed in said p-well and adjacent to a second edge of said floating gate, wherein said cell is programmed by:

forward biasing said p-well relative to deep n-well;
   positively biasing said control gate by a voltage sufficient to invert the channel between said source implant and said drain implant; and
   positively biasing said source and drain.

6. The cell of claim 5 wherein during programming said deep n-well is grounded and said p-well is positively biased.

7. The cell of claim 5 wherein during programming said control gate is biased to between 10 to 13 volts and said source implant and said drain implant is biased to between 5 to 7 volts.

8. The cell of claim 7 wherein during programming said deep n-well is grounded and said p-well is positively biased.

* * * * *